United States Patent [19]
Brady et al.

[11] Patent Number: 5,633,047
[45] Date of Patent: May 27, 1997

[54] ELECTRONIC DEVICES HAVING METALLURGIES CONTAINING COPPER-SEMICONDUCTOR COMPOUNDS

[75] Inventors: Michael J. Brady; Curtis E. Farrell, both of Brewster; Sung K. Kang, Chappaqua; Jeffrey R. Marino, Clifton Park; Donald J. Mikalsen, Carmel; Paul A. Moskowitz, Yorktown Heights; Eugene J. O'Sullivan, Upper Nyack; Terrence R. O'Toole, Hopewell Junction; Sampath Purushothaman, Yorktown Heights, all of N.Y.; Sheldon C. Rieley, Burlington, Vt.; George F. Walker, New York, N.Y.

[73] Assignee: International Business Machines Corporation, Armonk, N.Y.

[21] Appl. No.: 449,196

[22] Filed: May 24, 1995

Related U.S. Application Data

[62] Division of Ser. No. 200,811, Feb. 22, 1994.

[51] Int. Cl.$^6$ ..................................................... B05D 1/18

[52] U.S. Cl. ................. 427/437; 427/438; 427/443.1; 427/443.2

[58] Field of Search ................................ 427/437, 438, 427/443.1, 443.2

[56] References Cited

U.S. PATENT DOCUMENTS

| | | | |
|---|---|---|---|
| 4,657,632 | 4/1987 | Holtzman et al. | 156/659.1 |
| 4,878,253 | 10/1989 | Dixon, Jr. | 455/327 |
| 4,970,107 | 11/1990 | Akahashi et al. | 428/209 |
| 5,258,200 | 11/1993 | Mayernik | 427/8 |
| 5,284,798 | 2/1994 | Ibuka et al. | 437/184 |

*Primary Examiner*—Benjamin Utech
*Attorney, Agent, or Firm*—Daniel P. Morris

[57] ABSTRACT

Silicon and germanium containing materials are used at surface of conductors in electronic devices. Solder can be fluxlessly bonded and wires can be wire bonded to these surfaces. These material are used as a surface coating for lead frames for packaging integrated circuit chips. These materials can be decal transferred onto conductor surfaces or electrolessly or electrolytically disposed thereon.

3 Claims, 8 Drawing Sheets

ELECTRONIC DEVICES HAVING METALLURGIES CONTAINING COPPER-SEMICONDUCTOR COMPOUNDS

This is a division of application Ser. No. 08/200,811, filed Nov. 22, 1994 pending.

CROSS REFERENCE TO RELATED APPLICATION

Commonly assigned U.S. application Ser. No. 07/818,027, now abandoned filed Jan. 6, 1992, entitled "COPPER-SEMICONDUCTOR COMPOUNDS CAPABLE OF BEING PRODUCED AT ROOM TEMPERATURE" describes depositing Cu as a film on the surface of a single crystalline semiconductor substrate of Si or Ge, while the substrate is held at room temperature. It has been found that the materials will react by themselves over an extended period of time to form a Cu-silicide or Cu-germanide compound interface. The process may be used to produce interconnection metallization for integrated circuits, but, in the context of existing VLSI processes, heat is used to accelerate the formation using the minimum desirable parameters of a temperature of about 150° C. for about 20 minutes. Contrary to the belief in the art that Cu always diffuses in silicon, the resulting interface junction has been found to demonstrate superior (near ideal) current/voltage characteristics and can be used as a high temperature (600°–800° C.) stability Ohmic/Schottky contact to Si or as a Cu diffusion barrier. Additional embodiments involve a Cu layer on a Ge layer on Si substrate, a Cu layer on a $Si_x$, $Ge_{1-x}$, layer on Si substrate, and the use of an intermediate layer of a retractable metal such as W. Various other VLSI embodiments are also disclosed.

FIELD OF THE INVENTION

The present invention relates to electronic devices wherein electrical conductors have surfaces containing silicon and germanium containing materials. More particularly, wires are wire bonded to these surfaces, and solder is fluxlessly bonded to these surfaces. More particularly, the silicon and germanium containing materials are used as an intermediate layer in a stack of metal layers and as an intermediate layer between a metal and dielectric layer. More particularly, the materials of the present invention are electrically deposited and decal transferred. Most particularly, the materials of the present invention are covalent compounds of silicon and germanium.

BACKGROUND OF THE INVENTION

The metal copper has very good electrical conductivity. As a result there is currently a wide interest in the effort towards developing copper as an interconnection metallization in future packages for electronic devices. The increase in circuit density of VLSI (very large scale integration) places increasingly heavy demands on the electrical conductors on chips and on packaging substrates to which the chips are electrically interconnected. An increase in circuit density corresponds to a decrease in conductor dimensions which leads to higher resistances and current densities which increase the signal losses and promote electromigration damage to the conductors on the electronic devices and packages. The problems drive the development of high conductivity metallurgies based on copper or gold. Increased circuit density requires multiple interconnection levels which requires fully planarized structures which are achieved by complicated processes.

New materials are needed to reduce capacitive parasitics through low dielectric constants and also reduce residual stress while being susceptible to planarization. These, advanced materials and processes may have chemical incompatibilities with existing electrically conducting materials which may promote corrosion on the conductors, especially if copper is used as the electrical conductor. It becomes increasingly difficult to maintain the high conductivity of copper lines as dimensions are reduced in a case where protective over layers are added to protect against corrosion. Since the overlayers take up space reducing room allowed for high-conductivity copper.

Gold is a commonly used corrosion resistant material. Electrical conductors on semiconductor chips and packaging substrates are commonly coated with gold to avoid corrosion. However, gold is an expensive material and must be replaced with other materials which have low resistivity and good corrosion resistance if a reduction in the cost of fabrication of electronic devices and substrates is to be achieved. For example, lead frames which have a plurality of electrically conductive leads for electrically interconnecting semiconductor chip pads to packaging substrate pads are typically formed from copper having a gold coating. Moreover, state of the art test probes as described in commonly assigned U.S. patent application Ser. No. 07/583,621, filed Sep. 14, 1990, now abandoned, entitled "Flexible Tape Probe", the teaching of which is incorporated herein by reference, describes the use of gold coated copper TAB lead flames for testing semiconductor devices.

Applicants have discovered that the Si and Ge materials of the present invention provide a substantially less costly substitute for gold. Gold is resistant to corrosion, gold does not form an oxide on exposure to atmospheric oxygen and gold is solder wettable. The Si and Ge materials of the present invention are substantially as corrosion resistant as gold, do not form a surface oxide and are solder wettable.

Furthermore, gold is a commonly used surface metallization on semiconductor chip or packaging substrate contact pads to which wires are electrically connected by wire bonding and ultrasonic bonding. Quite surprisingly, it has been found that the Si and Ge materials of the present invention provide a surface as suitable as gold for wire bonding.

Furthermore, gold is a commonly used surface for metallization on semiconductor chip or packaging substrate contact pads to provide a surface to which solder, in particular, lead/tin solder can be bonded. Gold is a solder wettable surface. Quite surprisingly, it has been found that the Si and Ge materials of the present invention are solder wettable.

The properties of the Si and Ge containing materials of the present invention are comparable to that of gold. These materials are useful as an intermediate layer in multilayer metal structures, such as electrically conductive pads and lines in semiconductor chips and semiconductor chip packaging substrates.

Because the materials of the present invention are resistant to oxidization and act as a diffusion barrier to oxygen, they are useful as intermediate barrier layers to prevent oxide formation.

These and other objects, features and advantages of the present invention will become apparent from the following more detailed description and the drawings and claims appended thereto.

SUMMARY OF THE INVENTION

A broad aspect of the present invention is a semiconductor chip packaging structure having metallurgical structures containing silicon and germanium containing materials.

In a more particular aspect of the packaging structure of the present invention, the silicon and germanium containing materials are silicides and germanide.

In another more particular aspect of the packaging structure of the present invention, a wire bonded to a surface of the Si and Ge containing materials of the present invention.

In another more particular aspect of the structure of the present invention, a solder mound is solder bonded to a surface of the silicon and germanium containing materials of the present invention.

In another more particular aspect of the present invention, a lead frame selectively coated has a surface of the Si and Ge containing materials of the present invention. The lead frame provides electrical interconnection to a semiconductor chip.

Another broad aspect of the present invention is the electroless deposition of germanium containing materials.

Another broad aspect of the present invention is a method of decal transfer of the Si and Ge containing materials of the present invention. A layer of silicon or germanium is supported by a flexible support substrate.

DETAILED DESCRIPTION

In order for chips manufactured with solder mounds, such as, C4's, to be joined to substrates, such as pads on packaging substrates it is desirable that the pads have a solder wettable surface metallurgy for bonding. Aluminum/copper (Al/4% Cu) is a typical last wiring layer of a silicon chip or packaging substrate. A C4 cannot be solder joined directly to an Al/Cu surface layer. As described herein about below a solder bondable pad has a top Au layer overlying an intermediate adhesion and barrier layers. For example Cr/Cu/Au is a typical solder bondable surface metallurgical structure wherein the Cr layer is an adhesion layer and the Cu is a barrier layer to interdiffusion between the Au and metal layers below the Cr layer. There are, however, two problems if Cu is used. The Cu must be thick enough to support rework cycles and the Cu can interdiffuse with the Au and dissolve in the solder. To rework a soldered structure, the entire structure is heated to the melting temperature of the solder. At these temperatures enhanced interdiffusion can occur.

The Au is meant to keep the Cu from oxidizing and to provide a good surface for test probes and bonding. However, through long storage or through exposure to temperature excursions, the Cu and Au may interdiffuse and permit the Cu which reaches the surface to oxidize. This oxidized surface will inhibit proper reflow joining of the chip C4 to the substrate contact pad. The oxide will also result in a high contact resistance for test probing. One solution to the joining to remove the surface oxide problem is to process the wafer or substrate through an additional flux step to remove the surface oxide before the chip joining operation or testing. This is costly and time consuming.

A solution to the problem is to use the germanium or silicon containing materials of the present invention. Examples of these materials are the following covalent compounds $Cu_3Ge$, $Ni_3Ge$, $Cu_3Si$, and $Ni_3Si$. We describe herein the use of the silicon and germanlure containing materials of the present invention for packaging applications, eg. for chip joining. We also describe a simplified process for the production of the silicon and germanlure containing materials for a top surface (TSM) metallurgy for a contact pad as shown in FIG. 1.

Figure 1:
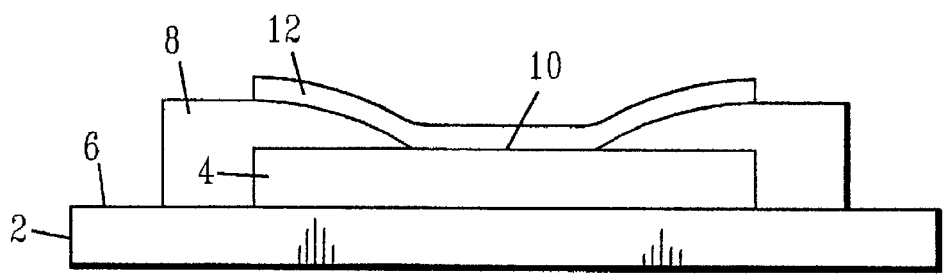
FIG. 1 shows a side view of a contact pad having a top surface of a Si and Ge containing material.

FIG. 1 shows substrate 2, such as an electronic device, eg. a semiconductor chip or packaging substrate, having an electrical conductor 4 disposed on surface 6 of substrate 2. Conductor 4 can be a contact pad or conducting line both of which can typically be of an Al/Cu material. Surrounding conductor 4 is passivation layer 8 which leaves exposed region 10 of conductor 4. Passivation layer 8 can be an organic or inorganic material, e.g. a polyimide, $SiO_2$ or $Si_3N_4$. A layer of the germanlure or silicon containing material 12 is disposed in contact with region 10. The thickness of layer 12 can be from about 1,000 to about 10,000 angstroms.

Selected deposition of patterns of the germanlure or silicon containing materials of the present invention having low resistivity can be achieved utilizing the processes described herein. For example, a photoresist or lift off stencil can be generated using standard semiconductor processing on a substrate or a molybdenum mask may be placed over the substrate. RF sputtering or ion-beam cleaning may be used to remove oxide, such as aluminum or copper oxide From the surface of the contact pads. For example, vacuum deposition at room temperature of a film of germanium on the order of 800 Å, is followed by a film of copper with a thickness on the order of 1200 Å. The host substrate is then heated to 100° C. for one hour, allowing a solid-state reaction to form the alloy $Cu_3Ge$. The substrate is then cooled to room temperature, removed from vacuum, and stripped of the photoresist stencil in acetone, or the molybdenum mask is removed if that masking technique was employed. The resulting ohmic contact is non-oxidizing with nominal values or resistivity in the range of 5–12 micro ohm-cm. Although the resistivity of this material is somewhat higher than that of pure copper, (>2 micro ohms-cm) the copper is stable in the $Cu_3Ge$ form and will not diffuse into the silicon substrate. For thicker or thinner films the above values can be adjusted to achieve the desired thickness. Copper germanide films of thickness from about 1,000 Å to 10,000 Å are most preferable. In the case of a substrate with heavily oxidized pads it may be desirable to add a thin 1,000 Å layer or Cr or Ti to the structure. The Cr or Ti is deposited on the pad surface after RF sputtering or ion beam cleaning and before the Ge is deposited. The order of deposition of the Cu and Ge can be reversed.

It may also be desired after the $C_3Ge$ alloy is formed, that a thin layer of Au be deposited on top of the alloy to provide a softer contact area for test probes.

Figure 2:
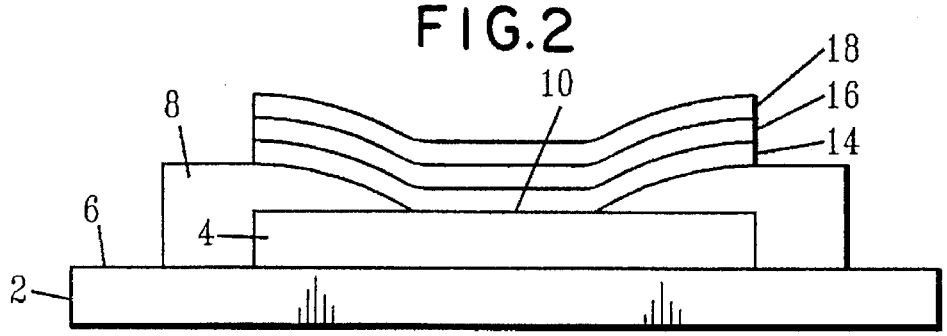
FIG. 2 shows a side view of another embodiment of the structure of FIG. 1 having a plurality of surface layers.

FIG. 2 shows an alternate embodiment of the structure of FIG. 1. All reference numerals common between FIG. 1 and FIG. 2 represent the same thing. On region 10 of pad 4, there is disposed an optional layer 14 of Cr or Ti of thickness of from about 200 Å to about 2,000 Å. Layer 14 is for for adhesion. On layer 14, there is disposed a layer 16 of a germanium or silicon containing material according to the present invention of thickness from about 1,000 Å to about 10,000 Å. On layer 16 there is disposed an optional layer 18 of soft material such as Au, Ag, In, Sn or Pb of thickness of from about 200 Å to about 2,000 Å.

Figure 3:
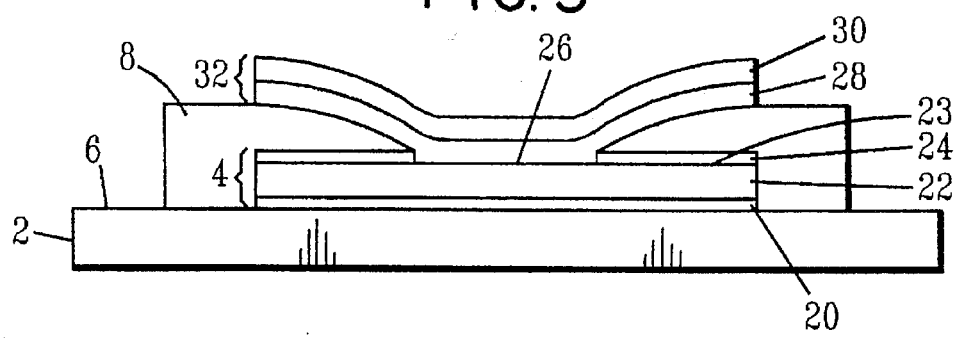
FIG. 3 shows a side view of another embodiment of a contact pad wherein the conductor to which the pad is electrically connected has a plurality of layers.
Figure 4:
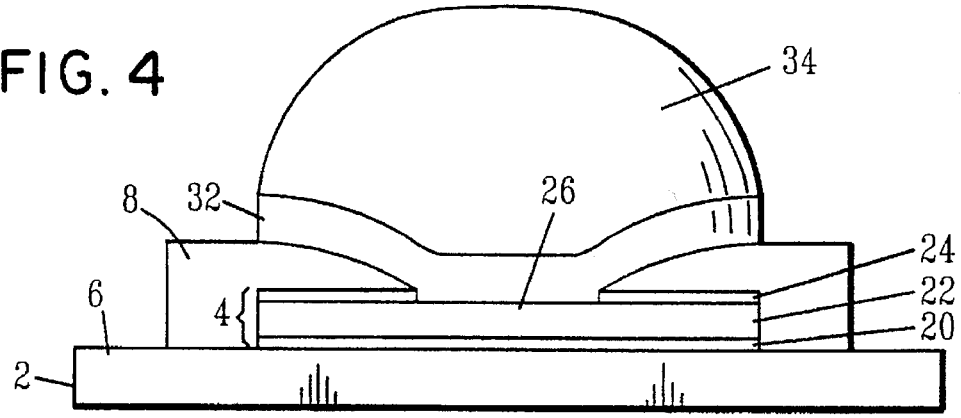
FIG. 4 shows a side view of a contact pad having a Si or Ge containing surface with a solder mound attached thereto.

FIG. 3 shows an additional embodiment of the invention which uses the germanium and silicon containing materials of the present invention for a top surface metallurgy (TSM) for substrates with Cu or Cr/Cu/Cr wiring. All numbers common between FIGS. 1, 2 and 3 represent the same thing. Pad 4 is comprised of a bottom layer 20 of Cr, an intermediate layer 22 of Cu and a top layer 24 of Cr. In this case, if $Cu_3Ge$ is used, it could be manufactured by cleaning any copper oxide, as described above, From the surface 23 of the top-level metal 24, or by using commonly used photolithography techniques to open the top layer 24 of Cr of the Cr/Cu/Cr structure 4 to expose Cu layer 22 at opening 26. A layer 28 of, For example, germanium, is deposited to a thickness of about 1,600 Å followed by a layer 30 of copper of thickness of about 1,200 Å. The process can then proceed as described above to form a copper germanide layer 32 from layer 28 and 30 as shown in FIG. 4. FIG. 4 additionally shows solder mound 34 bonded to copper germanide layer 32. The TSM layer consisting of $Cu_3Ge$ has several advantages over the conventional Cr/Cu/Au structure. Like Cr/Cu/Au it is wettable by solder. However, long exposure to the atmosphere at room temperature or above does not degrade the wettability of the $Cu_3Ge$ top layer. Thus, the pads coated with the germanlure or silicon containing materials of the present invention will not become oxidized when the substrate goes through a chip joining process. There is no need to apply flux to the germanlure or silicon containing layer or to expose it to an oven heating process to remove oxide prior to chip joining. The material should also service chip joining and rework processes with less dissolution of the $Cu_3Ge$ into the solder, thus avoiding the need For thick evaporation of copper. The solder mounds 34 can be any solder, such as those containing Pb,Sn, Au, Cd, In, Bi, Sb, Cu, 2N, 6A, and Ag.

Typically C4 solder mounds are disposed on an array of chip pads (typically by evaporation through a molybdenum mask). The chip with solder mounds thereon is disposed over a substrate having a corresponding array of pads. The substrate pads can have a germanium or silicon containing TSM layer to avoid oxidation of the surface of the substrate pad and to avoid using flux to solder join the C4's to the germanium or silicon containing TSM layer. C4 solder bonding is described in detail in U.S. Pat. No. 3,429,040 and U.S. Pat. No. 3,401,126, the teachings of both of which are incorporated herein by reference.

The resistivity of $Cu_3Ge$ has been measured by depositing a blanket film of $Cu_3Ge$ on a blanket film of aluminum that had been deposited on silicon. The aluminum film was isolated by etching a 5 mm strip through it. The $Cu_3Ge$ was then deposited over the aluminum and annealed at 100° C. The Al film was 300 Å, the $Gu_3Ge$ was 1870 Å. The measured resistivity of the $Cu_3Ge$ was 13 micro ohm-cm.

As noted herein above, a problem encountered in the use of Al/Cu (typically Al–4 percent Cu) contact metallurgy for Si semiconductor devices is that Si diffusion from the contact area into the adjacent Al interconnection metallurgy can occur during post-deposition heat treatments. To remedy this problem, which can lead to either high leakage current or shorting, silicon is added to the Al metallurgy in an amount (1.0 to 1.5 weight percent) of Si in Al in excess of that required to satisfy the Si solubility in Al (0.5 weight percent of silicon).

The problem is that the silicon layer evaporated on top of an aluminum contact metallurgy often does not completely diffuse into the aluminum. The result of residual silicon or Si oxide on the surface of the Al can lead to "no-stick" connections when wirebonds are made to the Al metallurgy.

A technique to eliminate the residual silicon or silicon oxide is to RIE the contact pad surface after the Si diffusion step. However, the result of this is that often there still remains Si and Si oxides after the RIE process and that in addition an intermetallic layer composed of Si, Cu, O, C. and F may be formed on the surface.

Figure 5:
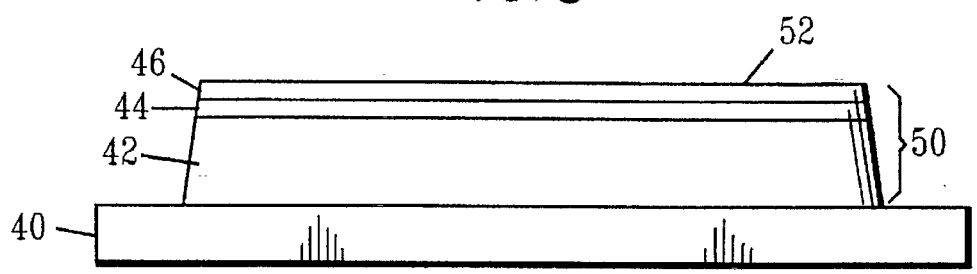
FIGS. 5, 6, and 7 show a side view of a method of fabricating the structure of FIG. 1.
Figure 6:
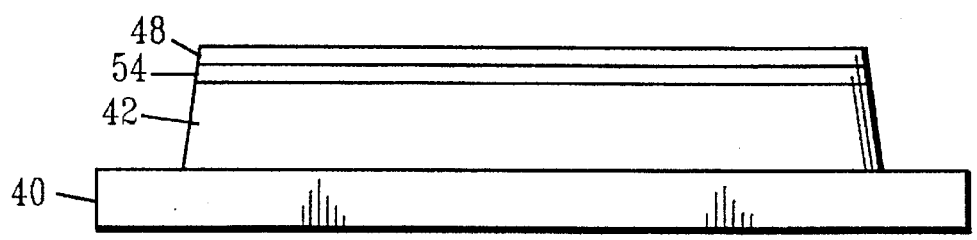
Figure 7:
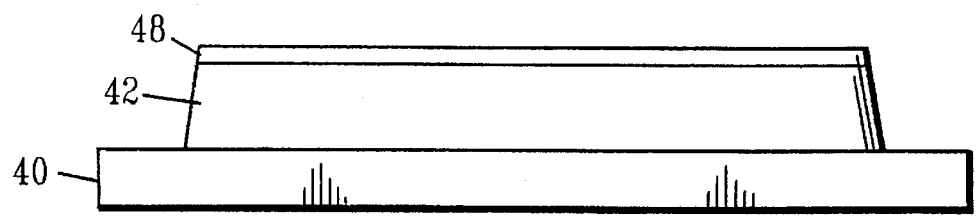

An invention herein which solves the problem of an undesirable surface residue is a new structure for a contact metallurgy which places the germanium or silicon containing material on the top surface of the Al metallurgy. It has been found that a wire can be bonded directly to the Al/Cu conductor which has Si diffused therein and capped with a layer of the germanium and silicon containing materials diffused therein of the present invention. FIGS. 5, 6 and 7 show steps in fabricating a structuring having a top surface of the germanlure and silicon containing compounds of the present invention. All reference numerals common between FIGS. 5, 6 and 7 represent the same thing.

The structure of FIG. 7 allows the use of standard Al/Cu contact metallurgy as well as other metallurgy, such as Cu alone. In FIG. 5 a micron Al/Cu layer 42 is deposited on substrate 40. Layer 44 of silicon is deposited on layer 42 typically by evaporation. A thin layer 46 of Cu is evaporated on the top surface of layer 44. Enough Si must be evaporated to form a layer of copper/silicon material according to the present invention and leave sufficient Si (of about 200 Å) to diffuse into the Al/Cu layer 42 to satisfy solubility requirements. The total is about 300 Å of Si when Followed by 150 Å of Cu. After the deposition of the Cu layer, the structure of FIG. 5 is heat treated from about 100° C. to about 300° C., preferably at 200° C. from about 10 minutes to about 60 minutes, preferably for 30 minutes to form the structure of FIG. 6. This forms layer 48 of a Cu/Si material of about 250 Å on the top surface 52 of metallurgical structure 50. Beneath layer 48, there is a layer 54 of Si. The structure of FIG. 6 is heat treated at 350° C. to 450° C. for 30 to 60 minutes to assure the diffusion of the Si in layer 54 into the Al/Cu layer 42 to satisfy solubility requirements. For the preferred embodiment, the processed structure consists of: approximately 1.0 micron of Al(4 percent)/Cu diffused with 0.5 percent of Si and capped by a few hundred Å of a Cu/Si material according to the present invention. The Cu/Si material exhibits a low resistivity, on the order of about 60 micro ohm-cm, and forms a good surface for wirebonding.

In the structure of FIG. 7, Si is typically used with Si devices and Ge is used with Ge devices.

Figure 8:
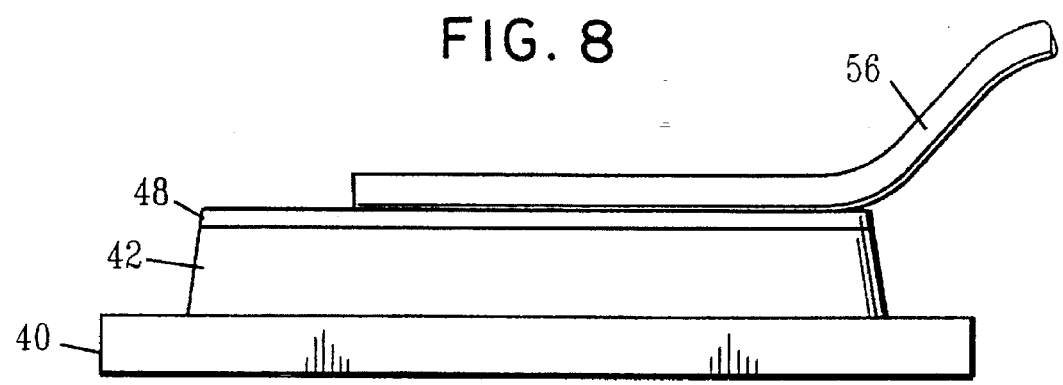
FIG. 8 shows a side view of a contact pad having a Si or Ge surface with a wire bonded thereto.

FIG. 8 shows the structure of 7 with wire 56 bonded to surface layer 18. Any commonly used wire can be used, such as Al, Cu or Au wire. Any commonly used wire bonding technique can be used such as thermocompression bonding, ultrasonic, thermosonic bonding, laser bonding and the like.

Figure 9:
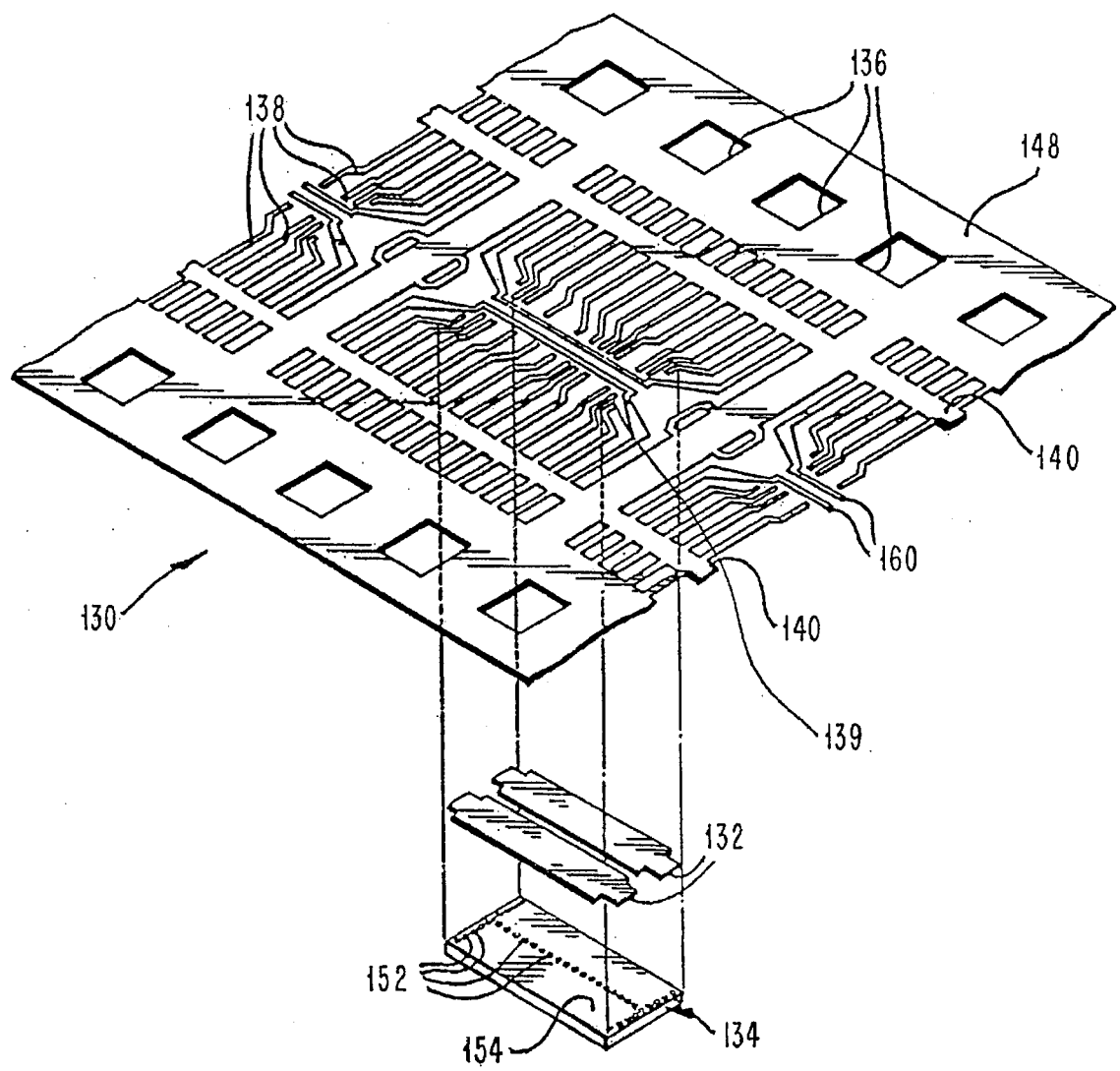
FIG. 9 shows a perspective view of a lead frame which can have selected regions containing the Si and Ge materials of the present invention.

FIG. 9 is a schematic representation of an exploded view or a lead frame 130, a dielectric film 132 which also acts as an alpha particle barrier and a semiconductor chip 134 showing the spatial relationship of these elements for one embodiment of the present invention. The lead frame 130 is produced From metal sheet stock, TAB (tape automated bonding) tape, flex tape, and the like and is provided with indexing holes 36. The lead frame can be Cu, Cu alloy, Alloy (42% Ni, 58% Fe), Invar (36% Ni, 64% Fe), Al or any other suitable electrical conductor. The lead frame 130 has a plurality of leads 138. Each lead 138 has an inner end 139.

The portion of the conductors 138 which extends over the semiconductor chip 134 is separated from semiconductor chip 134 by the dielectric film 132. At least the interior portions 38 are coated with the germanium and silicon containing materials of the present invention to permit wire bonding thereto as described herein below.

The dielectric film 132 is a polymeric film having a melting temperature in excess of 175° C. and does not contain ionizable species such as halides and active metals including Na, K and P. Polyimide films can be used as the dielectric film as suggested in U.S. Pat. No. 4,426,657 by Abiru, Sugimoto and Inomata. One such polyimide film is Dupont Kapton®.

The semiconductor chip 134 is attached to the lead frame conductors 138 by an adhesive layer not shown. A thin layer of adhesive is applied to the lead frame conductors or the top active surface 154 of chip 134. The top active surface 154 is one of the major surfaces of the chip 134. To avoid any possibility of short circuit to the chip in spite of the fact that the chips are usually coated with a passivating/insulating material, it is preferably to use a dielectric interposer. It is preferred that the dielectric interposer be all alpha barrier 132 positioned between the conductor and the chip. The adhesive layer can then be applied to both surfaces of the alpha barrier 132 with different adhesive materials used for each surface.

To effectively serve as an alpha barrier while still allowing for effective heat transfer the dielectric film 132 should be between about 1.5 and 2 mils thick.

The semiconductor chip 134 is attached to the dielectric film 32 by a first adhesive layer. The first adhesive layer is selected from the group of epoxies, acrylics, silicones and polyimides with silicones being preferred since they minimize corrosion.

The second adhesive layer attaches the dielectric film 132 to the conductors 138 and is selected from the group of epoxies, acrylics, silicones and polyimides. Preferably the second adhesive layer is selected from the group of epoxies and acrylics since these materials assure that the conductors 138 are fully bonded to the dielectric film 132, thereby enhancing the thermal conductivity between the semiconductor chip 134 and the conductors 138, and mechanically locking the lead frame conductors 138 to the semiconductor chip 134.

Cross members 140 are provided between the conductors 138 of the lead frame 30 to impart rigidity to the lead frame 130 and to limit flow of the encapsulating material when the semiconductor chip 134, dielectric film 132, and conductor 138 are encapsulated.

Figure 10:
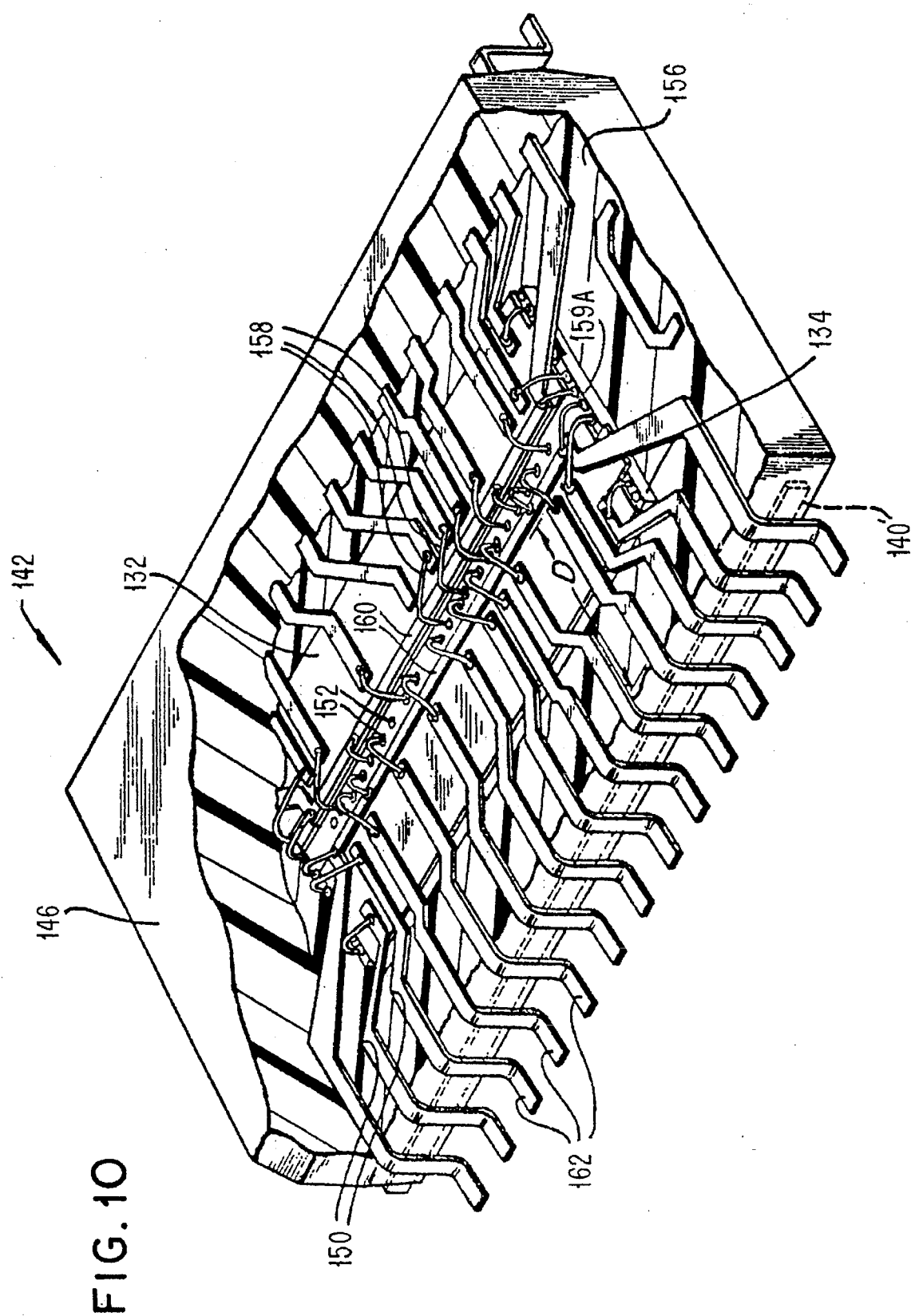
FIG. 10 shows a perspective view of a chip package using the lead frame of FIG. 9.

FIG. 10 shows a package 142 containing a semiconductor chip 134 in which part of the encapsulating material 46 has been removes. After encapsulation, the lead frame salvage 148 and the cross members 140 shown in FIG. 3 are removed. The conductors 138 which extend beyond the package 142 may be formed as required. The removed cross members are partially shown in phantom at 140' in FIG. 4.

The thickness of the conductors 138 should be minimized to ensure maximum top to bottom encapsulant sealing. The maximization of the encapsulant knitting at the part line 156 enhances crack resistance. Because a minimum path length of about 0.5 mm to 1 mm is needed to assure sealing of the conductors in the encapsulating material.

Encapsulant locking of the lead frame conductors 138 is achieved by providing the conductors 138 with sharp angles or kinks 150 as shown in FIG. 10. By providing the lead frame conductors with kinks the package of the present invention permits the width of the semiconductor module to be reduce while maintaining superior mechanical characteristics since the length of the leads within the packaging material is no longer limited by the distance between the chip and the edge of the package.

The conductors 138 should cover between 30% and 80% of the area of the surface of the semiconductor chip 134, and preferably a maximum percentage of the surface area. The conductors 138 should be positioned to avoid contact with terminal pads 152 on the semiconductor chip 134. This area maximization assures effective enhanced cooling of the semiconductor chip 134 and adequate bonding to the conductors 138 to the surface of semiconductor chip 134. The longer conductors 138 reaching over and adhering to the chip 134 result in a longer path (D) from the package exterior to the wire bonds thus increasing resistance to ingress of environmental contaminants which could produce corrosion and premature failure.

Extraction of heat from the active layer 154 of the semiconductor chip 134 which contains the terminal pads 152 is more effective than extraction of heat from the back side of the semiconductor chip as is done with the packaged semiconductor chips of the prior art.

The terminal pads 152 are connected to the conductors 138 by wires 158. The configuration of the conductors 138 is preferably such that wires 158 are less than about 30 mils long. Minimizing the length of the wires 158 improves the electrical performance of the packaged semiconductor chip.

Figure 11:
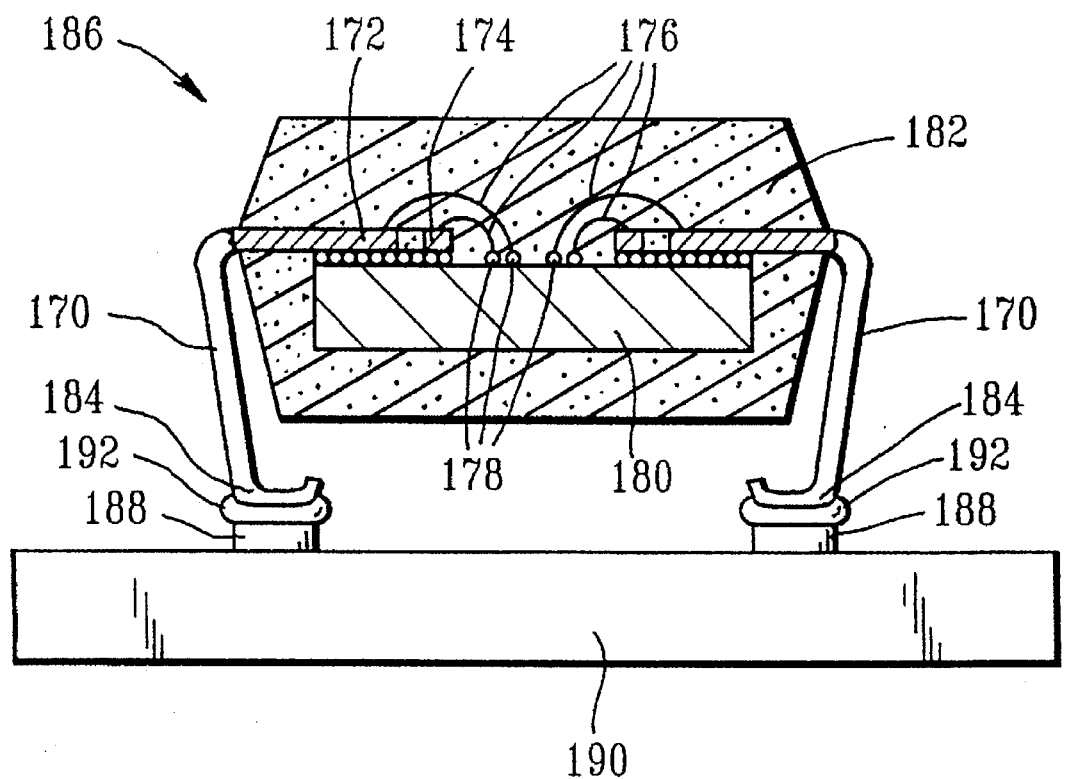
FIG. 11 shows a perspective view of a chip package using the lead frame of FIG. 9.

The structure of FIG. 10 is mounted onto a substrate (not shown) and the outer ends 162 ortho leads 138 are solder bonded to pads on the substrate as described herein above. FIG. 10 shows outer ends 162 of leads 138 bent outwardly away from package 142. The outer ends may be curled inwardly under package 142, such a lead is commonly referred to as a J-lead. FIG. 11 shows a schematic cross sectional view of a structure similar to that of FIG. 10. FIG. 11 shows lead frame 170 with wires 176 wire bonded between pads 178 on chips 180 and the inner ends 172 and 174 of leads 170. The chip and inner ends 172 and 174 are encapsulated in a molding compound 182 to form packaged chip structure 186. The outer ends 184 of lead 170 are curled inwardly towards package 186. The curled ends 184 can be bonded to substrate pads or contact locations 188 on substrate 190 by solder 192 as described herein above. The substrate 190 can be a printed circuit board, a metallized packaging ceramic substrate, flex tape and the like.

In summary, the invention of FIGS. 9, 10 and 11 consists of a leadframe, copper or otherwise, which has been coated with a suitable germanium or silicon containing material such as $Cu_3Ge$, $Ni_3Ge$, $Ni_3Si$ and $Cu_3Si$ or other phases of these binary compounds. The processes for forming the Si and Ge containing materials makes possible coating of any suitable lead frame material. The lead frame does not have to be copper. The coating may be applied to the location of the bonding pad (spot plating or coating) or may be used to cover the entire lead frame. Application of the Ge or Si containing materials may be accomplished by evaporation or by electroplating followed by heat treatment to form the material. For example, $Cu_3Ge$ and $Ni_3Ge$ may also be evaporated. $Cu_3Ge$ may be plated by electrolytic means. It is noted that $Cu_3Si$ forms a surface oxide at temperatures above 250° C. $Ni_3Ge$ may be plated by electroless means.

The unique properties of the germanium and silicon containing materials of the present invention provide an alternate bonding technique to solder bonding. Computer package components are generally limited by materials consideration as to the temperature to which they can be raised during an electrical or mechanical joining process. However, high-strength, high-conductivity (both electrical and thermal) connections are necessary to the art of computer packaging. Solder joints are commonly used for joining conductors. However, the use solder generally requires the application and subsequent cleaning of solder flux. In the case where good thermal or electrical conductivity is not required, organic epoxies may be used to join two components. However, epoxies are limited in their temperature range. Components that run hot, eg. power supplies, require a joining medium that can withstand elevated temperatures.

A structure according to the present invention consists of two or more components that may be printed circuit boards, flexible cables, or mechanical elements that are joined mechanically, thermally, and electrically if required, by means of the medium of the germanium and silicon containing materials of the present invention, eg. $Cu_3Ge$. The $Cu_3Ge$ serves as the adhesive and conductive medium. Each of the mechanical elements has a copper surface to which the $Cu_3Ge$ is in intimate contact in the joined structure. To fabricate this structure, each of the surfaces of the elements to be joined is fabricated in such a way as to have a copper surface. Printed circuit boards and flex cables are normally fabricated in such a manner. If the surface is not copper, then copper is applied by a suitable means: plating or evaporation, for example. Subsequently a layer of germanium is applied to at least one of the surfaces by a suitable means: plating or evaporation for example. The copper surface is cleaned and brought into intimate contact with the germanium surface at a moderate temperature, typically 100° to 200° C. and under pressure, typically in the range of 10 kpsi. The result is the formation of the structure shown in FIG. 12.

Figure 12:
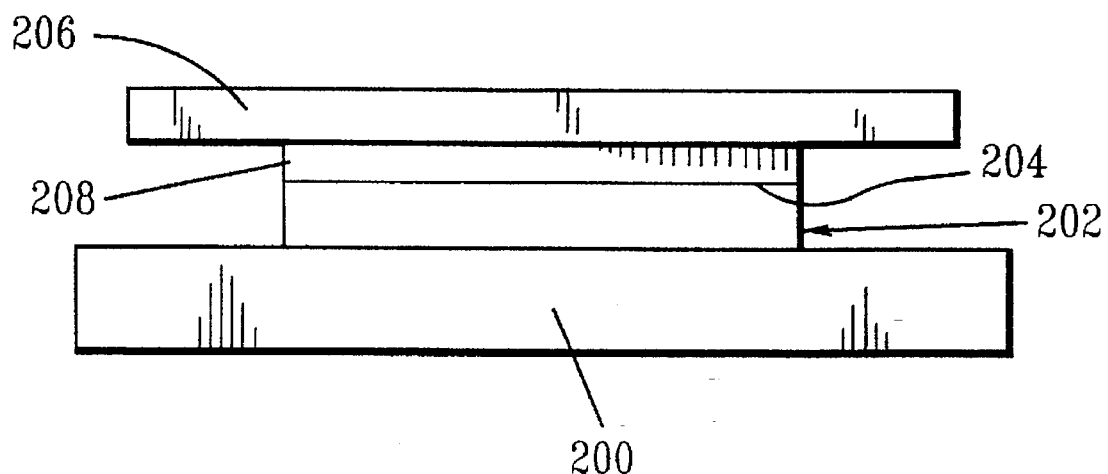
FIGS. 12 and 13 show a method of using the Si and Ge containing materials of the present invention as a bonding material between two conductors.
Figure 13:
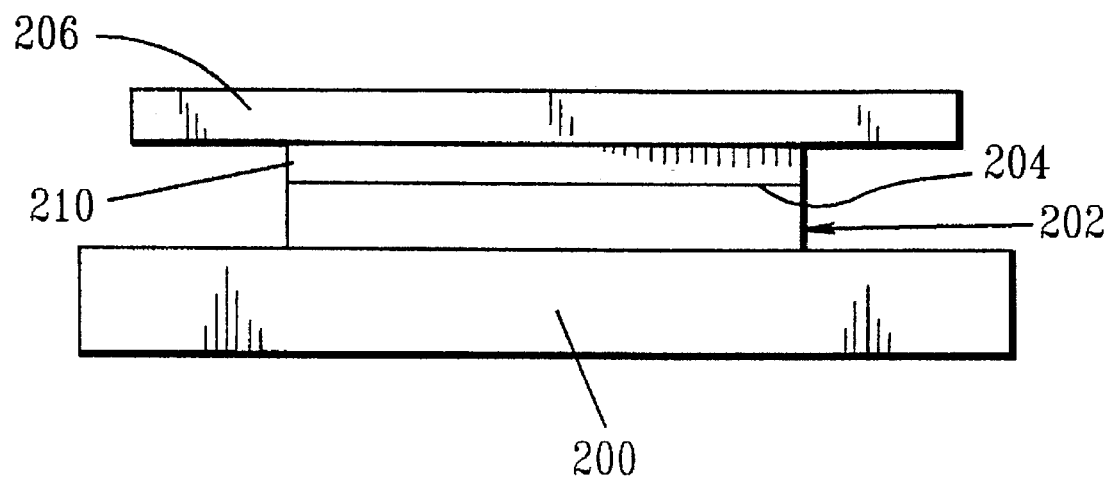

Referring to FIG. 12, on substrate 200 there is a metallurgical structure 202 having at the surface 204 thereof Cu or Ni. Another Cu or Ni object 206 such as inner ends 139 of leads 138 of FIG. 9 is adjacent surface 204 with a layer 208 of Ge or Si therebetween. After pressure and heat is applied, the structure of FIG. 13 is formed. Reference numerals common between FIGS. 12 and 13 represent the same thing. Layer 208 of FIG. 12 becomes layer 210 which is a germanium or silicon containing compound according to the present invention.

Additional examples of the use of this new bonding technique is as follows. In the first instance germanium was plated onto the contacts of a copper/polyimide flex cable. A mating copper printed circuit boards was first cleaned and then pressed to the cable at 20 kpsi for 60 minutes at 160° C. The result was a printed circuit board structure having metallurgical structure $Cu/Cu_3Ge/Cu/$Polyimide.

In order to test feasibility of joining polyimide and molybdenum elements for a power supply application the structures were as follows: (1) Mo substrate with evaporated 200 Å of chromium followed by 1.0 μm of copper; (2) 25 gm thick Upilex (other polyimide would be suitable) with evaporated layers consisting of 200 Å of chromium, 1.0 gm of copper, 2,000 Å of germanium. The copper surface was cleaned and pressed to the germanium surface as described above. The resulting laminated structure was: Mo/Cr/Cu/$Cu_3Ge$/Cu/Cr/Upilex. Pull tests performed on samples of the structure yielded strengths up to 30 g/mm.

A method for disposing Ge or Si layer 208 of FIG. 12 on either member 206 or surface 204 is the decal process which is a dry process For the transfer of germanium or silicon to a conductor, such as copper or nickel. The decal process can be used to form a passivation layer on the copper layer.

Figure 14:
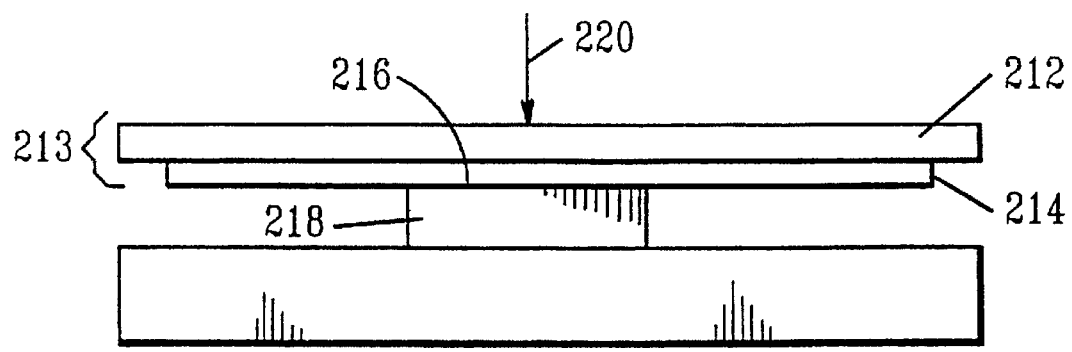
FIGS. 14, 14A and 14B show a decal transfer method for fabricating the Si and Ge containing materials of the present invention.
Figure 14A:
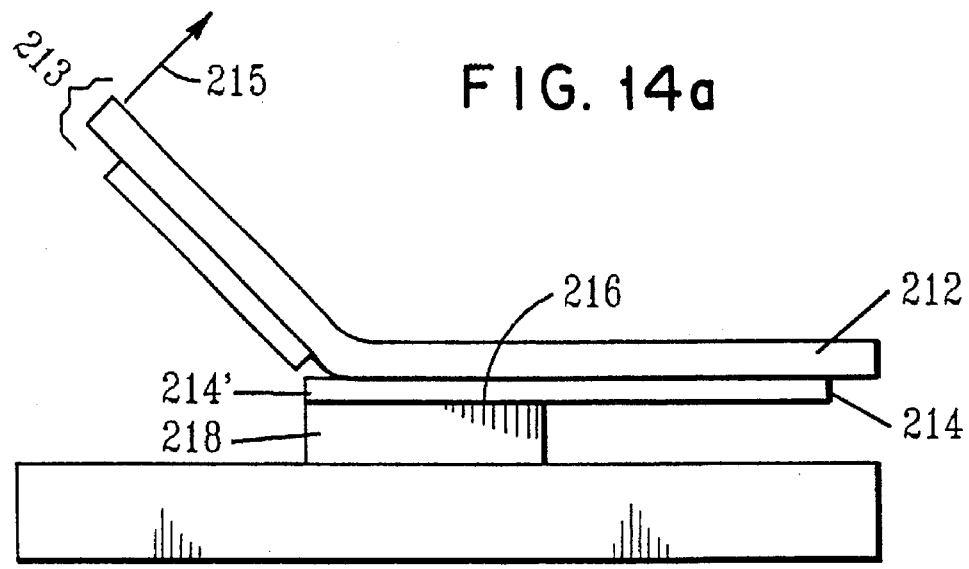
Figure 14B:
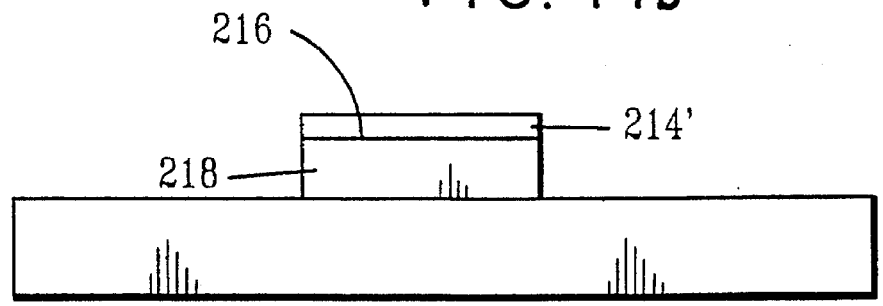

Referring to FIG. 14 the decal 13 consists of a thin flexible conformal substrate 212, for example, a polymeric material like Upilex or polyimide. On substrate 112 there is a thin 214 layer of elemental germanium or silicon. Layer 214 has a thickness in the range from about 500 Å to about 5,000 Å, most preferably about 1,000 Å. Layer 214 nay be produced by evaporation, sputtering, plating after seeding, or other suitable means.

The process consists of first cleaning the surface 216 of conductor 218. If 218 is Cu, a copper cleaning bath is used; for example sulfuric acid. Then the surface 216 is placed in contact with the germanium or silicon 214 of the decal 213. Next the two surfaces are brought into intimate contact through the application of suitable force, represented by arrow 220, by means of a press. A suitable press is a hydraulic press. The two pieces are held in the press at an elevated temperature from about 100 to 300° C., preferably at about 230° C., until a layer of a Ge or Si containing material, such as copper-germanium, preferably $Cu_3Ge$, is formed on the surface 216 of the copper line 218. A time of several minutes is sufficient. The pieces are then removed from the press and as shown in FIG. 14.1 the decal is pealed from the copper surface 216 as indicated by arrow 215, a Ge or Si coating 214 on the copper surface 216. FIG. 14.2 shows the resulting structure having a Ge layer 214 disposed on a Cu surface 216. As described above, heat can be provided to form a Si or Ge containing material according to the present invention. The new structure consists of a conductor, such as Cu, capped with a layer of a germanium or silicon containing material of the present invention.

Application may be made to any planarized or flexible copper substrate, such as thin film redistribution patterns of ceramic, silicon or other substrate. Printed circuit boards or portions of printed circuit boards with copper surfaces may be coated in this way, as may be flexible circuits (flex or TAB) (tape automated bonding) which use copper as a conductor. The decal film nay be patterned before application to produce a patterned coating on a continuous copper surface. The coating may also be applied in a continuous manner by pressing sheets between moving rollers.

When copper conductors are used in structures which contain polyimides as a dielectric material the copper lines can be passivated on their top surface to protect them from the action of the polyamic acid used to fabricate the next layer of polyimide insulation. The passivation is provided as described above. The structure shown consists of copper conductors with polyimide insulation. The top surfaces of the copper lines are passivated with a silicon or germanium containing material according to the present invention.

Figure 15:
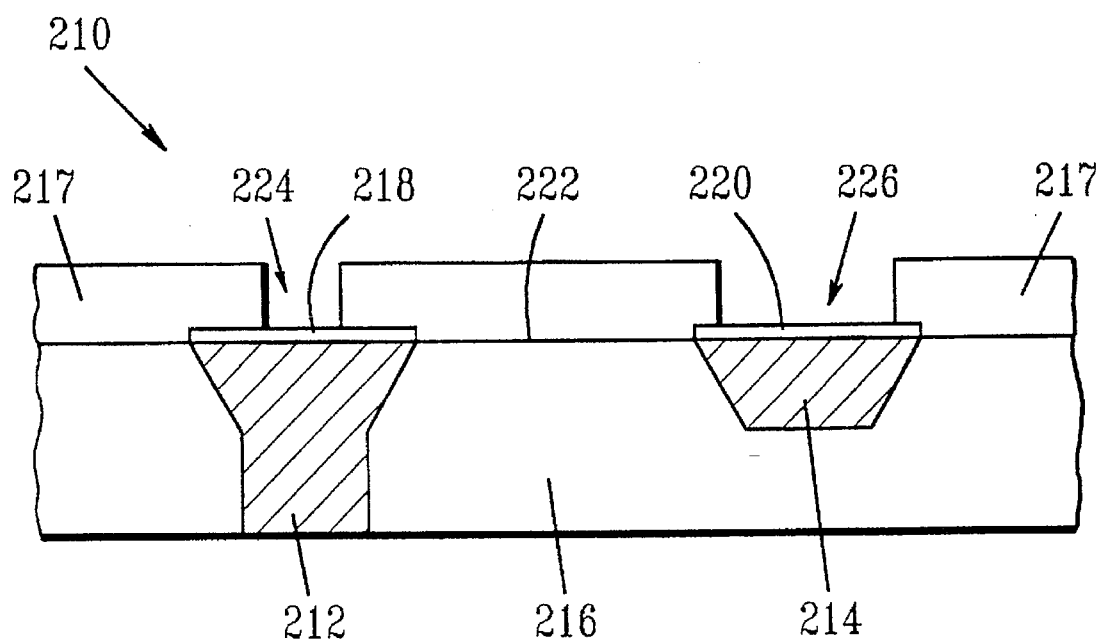
FIGS. 15 and 16 shows the use or the Si and Ge containing materials or the present invention as an intermediate layer in a metallurgical structure.

FIG. 15 shows a structure 210 having conductors 212 and 214 embedded in dielectric body 216. Conductors 212 and 214 have a top layer 218 and 220 respectively of a silicon or germanium containing material of the present invention. Polyamic acid (PAA) layer 217 is disposed on surface 222 of dielectric body 216. layer 217 has openings 224 and 226 exposing layers 218 and 220 respectively. Layer 217 is not in contact with conductor 212 and 214 since layers 218 and 220 are therebetween, respectively.

Layers 218 and 226 act as barrier layers to prevent Cu atoms from contacting the PAA layer 217. Cu atoms in contact PAA Form a complex which releases Cu oxide when the PAA is heated to cure to polyimide. Cu oxide particles are undesirable since they increase the dielectric constant of polyimide. The formation of Cu oxide particles in PAA is described in U.S. Pat. No. 5,053,272, the teaching of which is incorporated herein by reference.

The structure 210 of FIG. 15 is useful as semiconductor chip packaging substrate or the top metallization layers of such a substrate or as the top metallization layers of a semiconductor chip.

Figure 16:
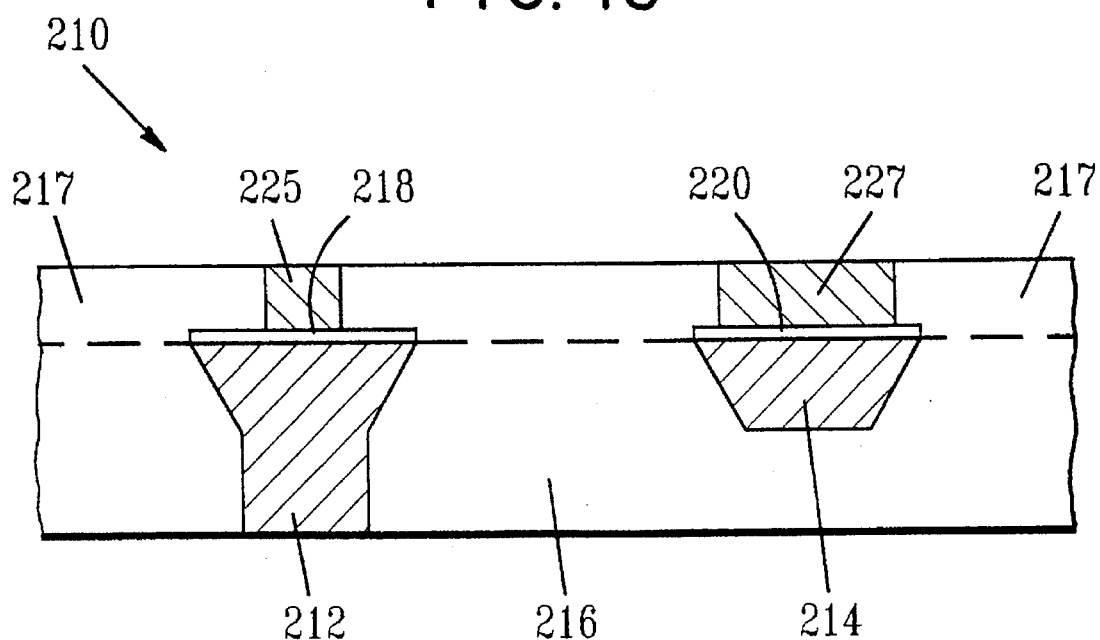

Space 224 and 226 of FIG. 15 can be filled with an electrically conductive material as shown in FIG. 16 as 225 and 227. After sintering PAA layer 217 becomes polyimide and if body 216 is polyimide surface 222 of FIG. 15 is no longer discernible. Therefore surface 222 is shown in FIG. 16 as a dashed line if two polyimide layers are laminated or glued together, they remain distinct layers. In FIG. 16, layer 218 is an intermediate layer between conductors 212 and 225 and layer 220 is an intermediate layer between conductors 214 and 227.

The Si and Ge materials of the present invention are useful as intermediate layers to act as interdiffusion barrier layers and corrosion inhibiting layers. This is particularly useful for conductors embedded in polymers, such as polyimide, which contain residual water which can act as an electrolyte for galvanic action between dissimilar metals. Galvanic action can lead to corrosion in the following metallurgical structure Cr/Cu/Cr or Cr/Cu/Ti/Au.

We disclose the introduction of the Si and Ge containing materials of the present invention, e.g., $Cu_3Ge$, between, for example, Cr and Cu interfaces with the intention of eliminating corrosion. We disclose a structure for which the copper or nickel layer is replaced by a layer of copper or nickel clad in a protective coating of the Si and Ge containing materials of the present invention. Alternatively we disclose a structure for which the copper layer is replaced in its entirety by these materials. For the example, a contact pad having the structure of Cr/Cu/Cr where the thickness's are 200 Å for the Cr layers and 3.5 μm for the Cu layer are replaced by a new structure consists of Cr/$Cu_3$Ge/Cu/$Cu_3$Ge/Cr, where the thickness's are as follows: for both Cr-200 Å, for both $Cu_3$Ge-5,000 Å Cu-2.5 μm. For the alternate embodiment, the new structure is Cr/$Cu_3$Ge/Cr. The thickness's are: both Cr-200 Å, $Cu_3$Ge- 3.5 μm.

A structure having layers Cr/Cu/Ti/Au where the thicknesses are: 200 Å for the Cr layer, 6 μm for the Cu layer, Ti-1 μm, Au-1 μm can be replaced by a new structure consists of Cr/CusGe/Cu/Ti/Au, where the thicknesses are as follows: Cr-200 Å, $Cu_3$Ge-5,000 Å, Cu-5.5 μm and Au-1 μm. For the alternate embodiment, the new structure is Cr/$Cu_3$Ge/Ti/Au. The thicknesses are: Cr-200 Å, $Cu_3$Ge-6 μm, Ti-1 μm and Au-1 μm.

There are two preferred methods of depositing a layer of the Si and Ge containing materials of the present invention, e.g., $Cu_3$Ge as an intermediate layer. The depositions are all carried out using the commonly known molybdenum mask procedure. The first method For fabrication of a layer of $Cu_3$Ge is to evaporate in sequence Cr, Ge, Cu, Ge, Cr using approximately 2,500 Å thickness for the Ge layers and 3.0 μm for the copper layer. The structure is annealed in-situ for 15 to 30 min at 200 to 300° C. Alternatively, the $Cu_3$Ge may be deposited directly using a previously manufactured source of the material. One deposition sequence is Cr, $Cu_3$Ge, Cu, $Cu_3$Ge, Cr.

The embodiment, in which all of the Cu is replaced by $Cu_3$Ge, may be carried out either by a direct deposition of the $Cu_3$Ge or by depositing alternating layers of Ge and Cu followed by the annealing step.

The lead Frame as shown in FIG. 9 can be fabricated to have a surface layer of a Si or Ge containing material using the electroless deposition following method which is described for deposition of $Cu_3$Ge on Cu. However, the method is not limited to this choice of materials.

We disclose an electrical contact whose surface consists of a layer of $Cu_3$Ge which has been formed over copper. The copper may constitute a thin layer or be the bulk material of the electrical contact. The bulk material of the contact may be copper or another suitable material over which copper may be plated, such as BeCu or CuNi or brass. The contact may be in the form of a spring, may constitute a portion of a conductor adhered to a flexible substrate, or may be a free standing electrical probe such as may be used for test applications.

We disclose a method by which the structure described above may be manufactured. If the bulk material of the contact is not copper, then first a layer of copper, on the order of 1,200 Å is plated on the surface. Then germanium on the order or 800 Å, ⅔ of the plated-copper thickness, is plated by electrical means over the bulk copper or over the thin copper layer over the bulk material. We have found that it is preferably to plate surfaces of undetermined area by using a constant voltage plating apparatus rather than a constant current source as described in the literature. The structure is annealed, typically at 200° C. for 30 minutes to form a layer of $Cu_3$Ge at the surface. The plating was accomplished using the following conditions. The bath was 7 percent $GeCl_4$ in propylene glycol with a temperature of 65° C. Plating was performed under constant voltage conditions. Solid germanium was used for the anode. Electrical contacts of such as in FIG. 1 were plated at 35 V for less than 5 minutes. Fine pitch test probes were plated with 35 V (drawing a current of about 1 amp) for 4 minutes.

The structures were annealed as described above. X-ray diffraction analysis performed on sample specimens confirmed the formation of $Cu_3$Ge .

This structure and process may be used on all electrical contacts or probe structures that are made of copper or upon which copper may be plated. The major advantages over the plating of gold are cost savings, and the production of a surface that is much harder than that of gold. The use of lead frames as test probes are described in detail in pending U.S. patent application Ser. No. 07/583,261 filed Sep. 14, 1990, the teaching of which is incorporated herein by reference.

In order that germanium compounds may be used for electronic packaging, so that structures may be manufactured in a cost-effective manner, electroless plating is desirable. An alternative, electroplating, requires that there be a common electrode. This is not always feasible. Processing by deposition requires the use of expensive processing equipment and time. Electroless plating solves these problems.

For example, we disclose a bath that may be used for electroless plating of germanium compounds onto a suitable substrate. Specifically, we disclose the plating of nickel-germanium, $Ni_3Ge$ onto copper. We disclose a contact to GaAs devices which consists of a layer of nickel followed by a layer of electroless nickel-germanium.

The plating bath consists of the following:

A first 500 ml aqueous bath is prepared. The bath contains 3 g/l of nickel sulfate heptahydrate, 9 g/l of tri-sodium citrate dihydrate, 20 g/l of sodium hypophosphite mono-hydrate.

A second 50 ml aqueous bath is prepared. The bath contains 50 g/l of germanium tetra-chloride, 135 g/l of sodium citrate, 48 g/l of citric acid.

The second bath is added to the first. At 85° C. the 550 ml volume is reduced to 500 ml by evaporation. Plating is accomplished on a copper substrate by submersion in the plating bath. The structures described above and shown in the figures may be produced by the electroless plating in nickel-germanium onto the appropriate substrate.

The nickel-germanium surface was tested for use in bonding applications. Wirebonds and solder contacts were readily made to he surface.

It is to be understood that the above described embodiments are simply illustrative of the principles of the invention. Various other modifications and changes may be devices by those of skill in the art which will embody the principles of the invention and fall within the spirit and scope thereof.

We claim:

1. A method comprising:
   electroless deposition of a $Ni_3Ge$ containing material on a surface.
2. The method of claim 1, wherein said surface is an electrical conductor.
3. The method of claim 2, wherein said electrical conductor is copper.

\* \* \* \* \*